United States Patent
Ino

(10) Patent No.: US 8,042,392 B2
(45) Date of Patent: Oct. 25, 2011

(54) ACCELERATION SENSOR

(75) Inventor: Yoshihiko Ino, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/654,675

(22) Filed: Dec. 29, 2009

(65) Prior Publication Data

US 2010/0101325 A1   Apr. 29, 2010

Related U.S. Application Data

(62) Division of application No. 11/306,207, filed on Dec. 20, 2005, now Pat. No. 7,650,787.

(30) Foreign Application Priority Data

Dec. 20, 2004  (JP) .................................. 2004-367933

(51) Int. Cl.
*G01P 15/08* (2006.01)
(52) U.S. Cl. ...................... 73/493; 73/514.33; 73/514.38
(58) Field of Classification Search ................... 73/493, 73/514.33, 514.36, 514.38
See application file for complete search history.

(56) References Cited

U.S. PATENT DOCUMENTS

| | | | |
|---|---|---|---|
| 5,005,414 A | 4/1991 | Holland et al. | |
| 5,081,867 A | 1/1992 | Yamada | |
| 5,233,874 A | 8/1993 | Putty et al. | |
| 5,487,305 A | 1/1996 | Ristic et al. | |
| 5,783,750 A * | 7/1998 | Otani | 73/721 |
| 5,828,116 A | 10/1998 | Ao | |
| 6,979,873 B2 | 12/2005 | Fujii | |
| 7,296,471 B2 | 11/2007 | Ono et al. | |
| 7,568,390 B2 * | 8/2009 | Shizuno | 73/493 |

FOREIGN PATENT DOCUMENTS

| | | |
|---|---|---|
| JP | 3-202778 A | 9/1991 |
| JP | 9-061448 A | 3/1997 |
| JP | 10-123166 A | 5/1998 |

* cited by examiner

*Primary Examiner* — John Chapman, Jr.
(74) *Attorney, Agent, or Firm* — Rabin & Berdo, P.C.

(57) ABSTRACT

An acceleration sensor has a semiconductor acceleration sensor chip and a case. The semiconductor acceleration sensor chip has a fixed portion, a plummet portion surrounding the fixed portion without contacting the fixed portion, and a beam portion connecting the fixed portion and the plummet portion, the thickness of the beam portion being thinner than the thickness of the fixed portion. The case has a cavity housing the semiconductor acceleration sensor chip, and a projection portion formed on the bottom face of the cavity, the bottom face of the fixed portion being fixed to the top face of the projection portion.

5 Claims, 5 Drawing Sheets

AREA OF FIXED PART 11 : $L^2$
AREA OF FIXED PART 21 : $\pi/2 \times L^2$

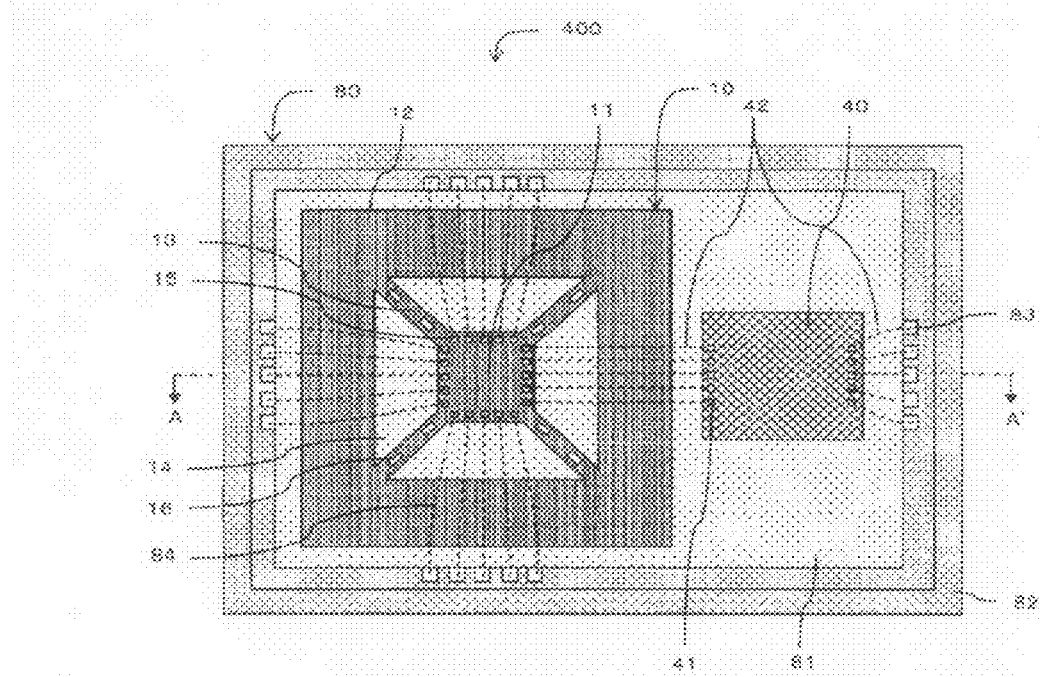

ACCELERATION SENSOR

CROSS-REFERENCE TO RELATED APPLICATIONS

This is a division of U.S. application Ser. No. 11/306,207, filed on Dec. 20, 2005. The present divisional application claims the benefit of priority of Japanese application number 2004-367933, filed Dec. 20, 2004. The disclosures of the parent US application and the Japanese priority application are incorporated herein by reference.

BACKGROUND OF THE INVENTION

1. Field of the Invention

The present invention relates to an acceleration sensor, which in particular is capable of detecting accelerations acting upon three axes, respectively.

2. Background Information

In recent years, acceleration sensors are widely used in all kinds of precision instruments, cars, robots and other various industrial fields. Especially, there is an increasing demand for a semiconductor acceleration sensor, which uses an MEMS (micro electro mechanical system) technology, as it is small in size, light, accurate and reliable in operation, and available at low cost.

In most semiconductor acceleration sensors, the piezoresistance effect, i.e. a phenomenon in which an electric resistivity changes in proportion to stress, is used in detecting acceleration. A common semiconductor acceleration sensor, for instance, is formed by having a semiconductor acceleration sensor chip fixed on a pedestal of a ceramic substrate forming a portion of a package. This semiconductor acceleration sensor chip has a plummet disposed in a central portion of the semiconductor acceleration sensor chip and four flexible beams which hang the plummet such that the beams will bend in response to the accelerations acting on the plummets. The four flexible beams and the plummet are formed by processing one semiconductor substrate. On the surfaces of the four flexible beams, piezo elements are formed, respectively, and these piezo elements constitute a Wheatstone bridge circuit. When stress occurs at the beam by the act of acceleration, the resistance balance of the Wheatstone bridge will change, and the acceleration is detected by having this resistance change measured as a current change or a voltage change.

For example, inventions relating to the acceleration sensor are disclosed in Japanese Patent No. 2127840, p. 11, FIG. 11 (hereinafter to be referred to as Patent Reference 1), Japanese Laid Open Patent Application No. 9-61448, pp. 2-3, FIG. 3 (hereinafter to be referred to as Patent Reference 2) and Japanese Laid Open Patent) Application No. 10-123166, pp. 5-8, FIGS. 1-6 (hereinafter to be referred to as Patent Reference 3).

The invention disclosed in Patent Reference 1 relates to a semiconductor acceleration sensor using piezo elements, and it has an acting unit (a plummet portion) in a peripheral portion of a silicon monocrystal substrate that performs the main functions of the semiconductor acceleration sensor, flexible portions (beam portions) inside the acting unit, and a fixed portion in a central portion of this silicon monocrystal substrate. The monocrystal substrate is fixed directly to the bottom face of the package through the conical pedestal disposed on the under surface of the fixed portion. When a cylindrical plumb disposed on the under surface of the acting portion (plummet portion) is displaced due to acceleration, this displacement is transmitted to the flexible portions (beam portions) of the monocrystal substrate, and stress accrues on piezo elements formed on the flexible portions. Thereby, the acceleration applied to the semiconductor acceleration sensor is detected. With this semiconductor acceleration sensor structure, the displacement of the plumb in the right and left directions is made to stay within a predetermined limit by a gap formed between the plumb and the pedestal.

The invention disclosed in Patent Reference 2 relates to an acceleration sensor using piezoelectric ceramics. With respect to the invention disclosed in Patent Reference 2, in mounting the acceleration sensor of which one end is closed on a circuit substrate, an integrated circuit for sensor driving is disposed in between the acceleration sensor and the circuit substrate. Due to such arrangement, the mounting area for the acceleration sensor can be minimized, the circuit pattern of the circuit substrate can be shortened, and noise resistance can be improved.

The invention disclosed in Patent Reference 3 relates to a semiconductor acceleration sensor using a piezo element. With respect to the invention disclosed in Patent Reference 3, a semiconductor acceleration sensor chip having a plummet portion hung by beam portions is fixed on a pedestal which is formed by a material having the same thermal expansion coefficient as the semiconductor acceleration sensor, and the pedestal and the plummet portion are disposed closely such that an air gap between the two stays within a range of 7 to 15 μm. With this semiconductor acceleration sensor structure, it is possible to damp the vibrations of the plummet portion by means of air damping between the plummet portion and the pedestal, and stabilize the output characteristic of the sensor, by which a comparatively low level of acceleration can be detected.

In order to minimize the size of the semiconductor acceleration sensor, it is necessary to minimize and reduce the thickness of the plummet portion. Normally, when the plummet portion is minimized or made thinner, the moment of inertia becomes smaller, which desensitizes the acceleration sensor. Therefore, in this case, it is also necessary to reduce the thickness of the flexible beam portion in order to raise the sensitivity of the acceleration sensor. However, making the beam portion thinner deteriorates the shock-resistance of the semiconductor acceleration sensor, and the semiconductor acceleration sensor may become vulnerable to external shocks, such as shocks caused by dropping. Moreover, when the beam portion is made thinner, the semiconductor acceleration sensor may be damaged by receiving shocks in its manufacturing process, which can result in a reduction in the yield ratio. For instance, the semiconductor acceleration sensor may be damaged by water pressure during the dicing process or by force that can be applied to it during pick up. Considering these problems, a semiconductor acceleration sensor which can have a small size and thin configuration, and which can have improved shock-resistance, is required.

In the acceleration sensor of Patent Reference 1, the fixed portion is formed in the central portion of the silicon monocrystal substrate, and the monocrystal substrate is fixed directly to the bottom face of the package through the conical pedestal disposed on the under surface of the fixed portion. Therefore, it is necessary to have a process of forming a gap between the under surface level of the cylindrical plumb disposed on the under surface of the acting unit (plummet portion) in the peripheral portion, and the under surface level of the conical pedestal disposed on the under surface of the fixed portion. It is a problem because such process may complicate the overall manufacturing process. In addition, Patent Reference 1 does not make any reference to the shock-resistance of the acceleration sensor, especially the shock-resistance of the beam portion.

In the acceleration sensor of Patent Reference 2, a plummet portion is disposed in a central portion of the bottom-bearing cylindrical acceleration sensor to which piezoelectric ceramics are used as its material. Therefore, in order to minimize the size of the acceleration sensor, it is necessary to minimize and reduce the thickness of the plummet portion and to reduce the thickness of the flexible portions having sensor functions at the same time. Accordingly, it is a problem because the shock-resistance of the acceleration sensor may be deteriorated due to such arrangement, and the acceleration sensor may become vulnerable to external shocks.

In the acceleration sensor of Patent Reference 3, the plummet portion is formed in a central portion of a semiconductor substrate, and it is supported by a frame body in a peripheral portion through the flexible beam portion. Therefore, in order to minimize the size of the acceleration sensor, it is necessary to minimize and reduce the thickness of the plummet portion and to reduce the thickness of the flexible beam portion at the same time. Accordingly, it is a problem because the shock-resistance of the acceleration sensor may be deteriorated due to such arrangement, and the acceleration sensor may become vulnerable to external shocks.

In view of the above, it will be apparent to those skilled in the art from this disclosure that there exists a need for an improved acceleration sensor. This invention addresses this need in the art as well as other needs, which will become apparent to those skilled in the art from this disclosure.

SUMMARY OF THE INVENTION

It is therefore an object of the present invention to resolve the above-described problems, and to provide an acceleration sensor which can have a small size and thin configuration, and which can have improved shock-resistance.

In accordance with one aspect of the present invention, an acceleration sensor has a semiconductor acceleration sensor chip and a case. The semiconductor acceleration sensor chip has a fixed portion, a plummet portion surrounding the fixed portion without contacting the fixed portion, and a beam portion connecting the fixed portion and the plummet portion, the thickness of the beam portion being thinner than the thickness of the fixed portion. The case has a cavity housing the semiconductor acceleration sensor chip, and a projection portion formed on the bottom face of the cavity, the bottom face of the fixed portion being fixed to the top face of the projection portion.

In accordance with another aspect of the present invention, an acceleration sensor has a semiconductor acceleration sensor chip, an integrated circuit and a case. The semiconductor acceleration sensor chip has a fixed portion, a plummet portion surrounding the fixed portion without contacting the fixed portion, and a beam portion connecting the fixed portion and the plummet portion, the thickness of the beam portion being thinner than the thickness of the fixed portion. The integrated circuit is fixed to the bottom face of the semiconductor acceleration sensor chip. The case has a cavity housing the semiconductor acceleration sensor chip and the integrated circuit, the bottom face of the integrated circuit being fixed to the bottom face of the cavity of the case.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 5A and FIG. 5B are diagrams showing the structure of a semiconductor acceleration sensor according to a fourth embodiment of the present invention.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 1A:
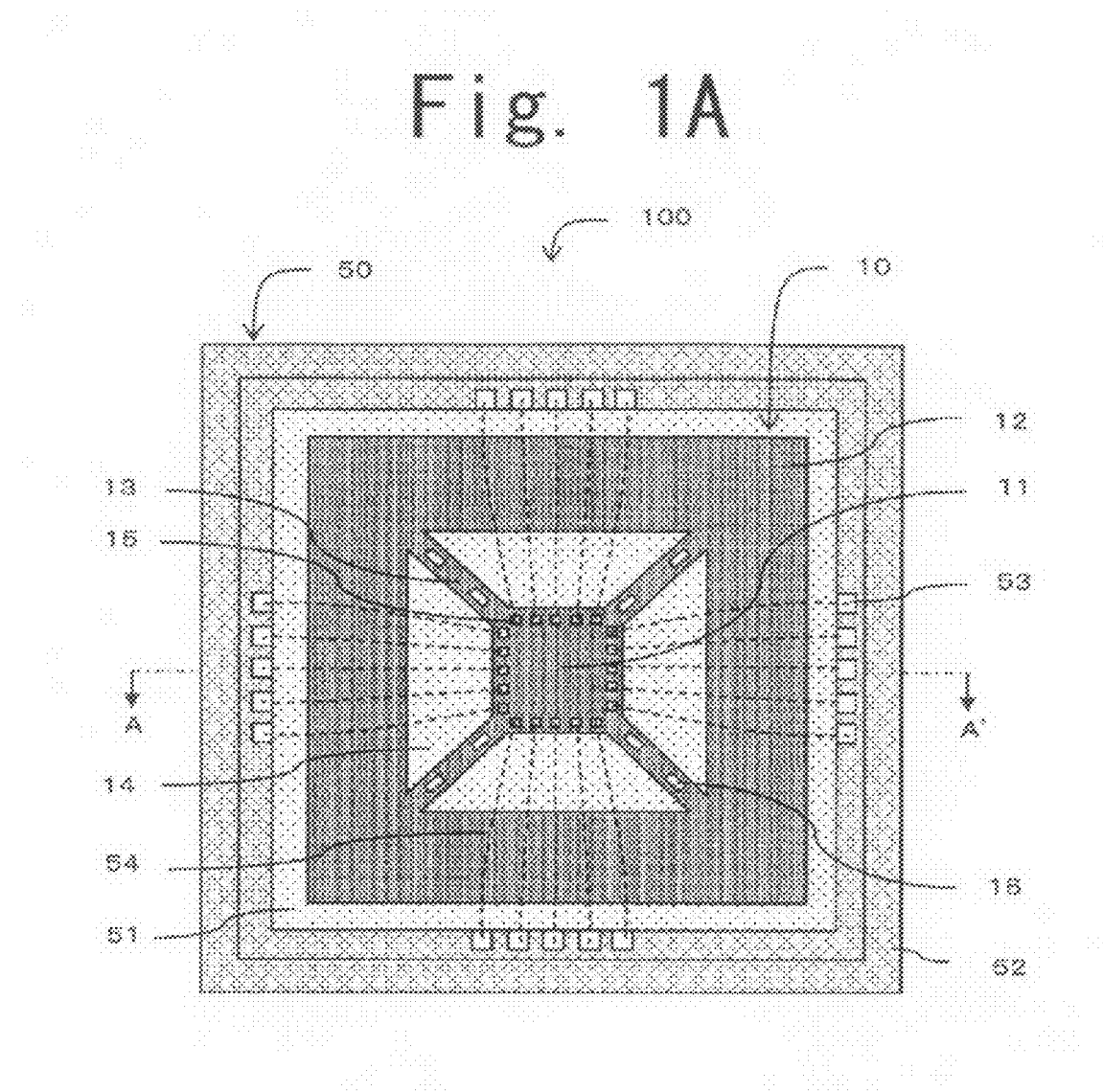
FIG. 1A and FIG. 1B are diagrams showing the structure of a semiconductor acceleration sensor according to a first embodiment of the present invention.
Figure 1B:
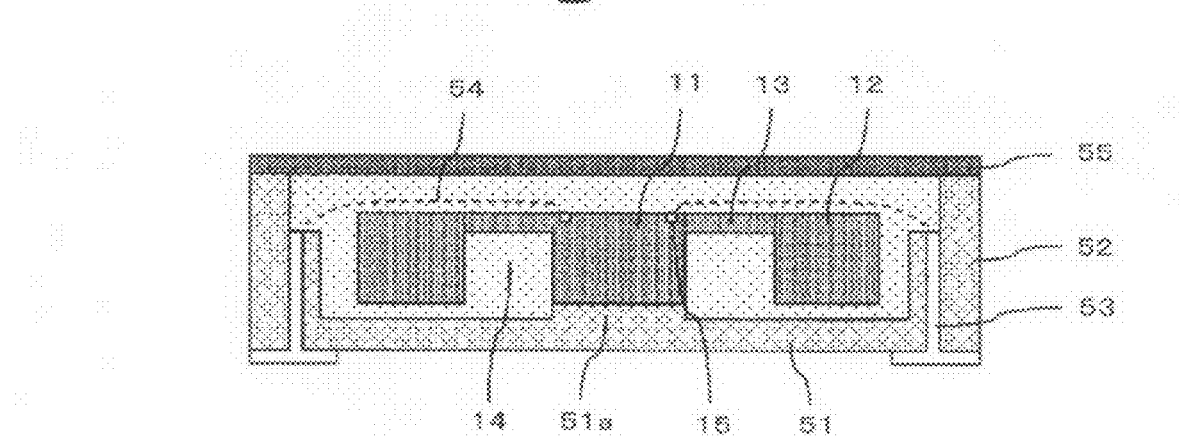

FIG. 1A and FIG. 1B are diagrams showing the structure of a semiconductor acceleration sensor 100 according to a first embodiment of the present invention. FIG. 1A is a plan view of the semiconductor acceleration sensor 100 when it is viewed from above, and FIG. 1B is a sectional view of the semiconductor acceleration sensor 100 taken along a line A-A' shown in FIG. 1A. Note that for convenience of explanation, FIG. 1A shows a state in which the cover 55, which is supposed to be placed on the upper surface of the semiconductor acceleration sensor 100, is removed.

The semiconductor acceleration sensor 100 has a semiconductor acceleration sensor chip 10 housed in a case 50 and it is hermetically sealed by a cover 55.

The semiconductor acceleration sensor chip 10 is formed using a silicon semiconductor substrate, for instance, and it has a fixed portion 11, a plummet portion 12 and beam portions 13.

The fixed portion 11 is placed at a central portion of the semiconductor acceleration sensor chip 10, and it has a square column structure in which the shape thereof when viewed from above is an approximate square. A plurality of electrode pads 15 (which will be described later on) are disposed on the upper surface of the fixed portion 11 at predetermined intervals. The electrode pads 15 serve to take out signals from piezo elements 16 (which will be described later on) to the outside. The under surface of the fixed portion 11 is fixed on a projection portion 51a which is formed on a bottom face portion 51 of the case 50 (which will be described later on).

The plummet portion 12 is a frame like portion shaped in an approximate square, and it is located in a peripheral portion of the semiconductor acceleration sensor chip 10 and formed in a way which surrounds the fixed portion 11. By having the plummet portion 12 disposed in the peripheral portion of the semiconductor acceleration sensor chip 10, it is possible to set the volume of the plummet portion to be larger than the structure of the conventional semiconductor sensor chip, i.e. the structure in which the plummet portion is placed at a central portion of the semiconductor acceleration sensor chip. Thereby, even if the overall structure of the semiconductor acceleration sensor chip is made thinner, a predetermined moment of inertia will act, and it will be possible to prevent the sensitivity of the acceleration sensor from deteriorating. Moreover, the under surface of the fixed portion 11 and the under surface of the plummet portion 12 are formed at approximately the same height. This means that the manufacturing process of the semiconductor acceleration sensor chip 10 can be simplified. To be more precise, with respect to the structure of the conventional semiconductor acceleration sensor chip, a gap has to be formed between the under surface of the plummet portion and the under surface of the fixed portion in order to let the plummet portion displace more freely in response to the effects of acceleration, and an etching process is required in forming this gap. However, with respect to the semiconductor acceleration sensor chip 10 of this embodiment, since the under surface of the fixed portion 11 and the under surface of the plummet portion 12 are formed at approximately the same height, there is no need for such etching process in order to form the gap.

The plummet portion 12 and the fixed portion 11 are separated by a gap 14. In an approximate central portion of each edge of the fixed portion 11 and the plummet portion 12, the gap 14 has a spacing of about 0.3 mm between the fixed portion 11 and the plummet portion 12, for instance, and this spacing of the gap 14 is set wider than the structure of the conventional semiconductor acceleration sensor chip. Thereby, it is possible to prevent possible foreign substance, such as chips that have fallen during the dicing process etc., from entering into the gap and disturbing the operation of the acceleration sensor.

The beam portions 13 are plate portions or thin portions of the semiconductor substrate, and they connect the fixed portion 11 and the plummet portion 12. The beam portions 13 are formed such that each beam portion 13 connects each diagonal points of the fixed portion 11 and the plummet portion 12, and they are formed to have flexibility so that they will bend in response to the vertical and horizontal movements of the plummet portion 12. On the upper surface of each beam portion 13, a plurality of piezo elements 16 are formed at predetermined intervals. The piezo elements 16 will have their resistance values changed as the beam portions 13 bend in the vertical and horizontal directions by the act of acceleration. Signals based on the changes of resistance values of the piezo elements 16 are taken out to the outside by wirings (not shown) through the electrode pads 15. According to this embodiment, since the semiconductor acceleration sensor chip 10 has a structure in which the plummet portion 12 is located in the periphery of the semiconductor acceleration sensor chip 10, it is possible to set the area of the plummet portion 12 to be large, as mentioned above. Accordingly, it is possible to acquire a desirable level of sensitivity in the acceleration sensor without having to reduce the thickness of the beam portions 13. Furthermore, by disposing the beam portions 13 in the diagonal directions of the fixed portion 11 and the plummet portion 12, it is possible to set the length of the beam portions 13 to be long, and thereby it is possible to improve the sensitivity of the acceleration sensor even more.

The case 50 is formed using a ceramic, for instance, and it has a bottom face portion 51 and a side portion 52.

The bottom face portion 51 has a projection portion 51a at its central portion, and the outer shape of the projection portion 51a when viewed from above is an approximate square. The semiconductor acceleration sensor chip 10 is supported by and fixed to the bottom face portion 51 via the upper surface of the projection portion 51a. The fixation of the semiconductor acceleration sensor chip 10 to the upper surface of the projection portion 51a is done, for example, by hardening a thermosetting resin such as epoxy resin, silicon resin etc., by a heat treatment at 150° C. for 1 hour. The height of the projection portion 51a is 30 µm, for instance, and the height of the fixed portion 11 of the semiconductor acceleration sensor chip 10 can be made effectively higher than the plummet portion 12 by as much as the height of the projection portion 51a. Due to such arrangement, without touching the bottom face portion 51, the plummet portion 12 is able to move freely in response to the act of acceleration. For instance, the projection portion 51a can be formed when manufacturing the case 50 made of ceramic, by attaching an approximately square green sheet, which is supposed to become the projection portion 51a, to the surface of a portion of ceramic material, i.e. the surface of a green sheet, which is supposed to become the bottom face portion 51, and then sinter the square green sheet. As to a manufactured case which does not have the projection portion 51a, it is possible to form the projection portion 51a by attaching an approximately square resin film (e.g. epoxy film) during the mounting process of the semiconductor acceleration sensor chip 10.

The side portion 52 is a sidewall of the case 50 which is formed to be integrated with the bottom face portion 51. In the central portion of each of the four sides of the side portion 52, a plurality of wiring holes are formed, and external wiring electrodes 53 leading to the exterior of the case 50 are disposed at predetermined intervals so as to pass through these wiring holes. The electrode pads 15 of the semiconductor acceleration sensor chip 10 and the external wiring electrodes 53 are electrically connected by bonding wires 54. In this case, for instance, wire bonding is done by using gold wires as materials, and by an ultrasonic concomitant thermocompression bonding method at a temperature of 230° C. In the semiconductor acceleration sensor chip 10 of this embodiment, since the electrode pads 15 are disposed on the surface of the fixed portion 11 which is supported and fixed by the projection portion 51a, the semiconductor acceleration sensor chip 10, especially the beam portions 13, will not be damaged in the wire bonding process for connecting the electrode pads 15 and the external wiring electrodes 53.

On the upper portion of the case 50, a metal cover 55 is attached. The cover 55 is made using 42 alloy, SUS (stainless steel), etc. as a material, and it is attached on the side portion 52 of the case 50 using a thermosetting resin so that the case 50 is sealed. The interior of the case 50 is purged by an $N_2$ gas or a dry air.

According to the semiconductor acceleration sensor 100 of the first embodiment of the present invention, the plummet portion 12 of the semiconductor acceleration sensor chip 10 is disposed in the peripheral portion, and thereby it is possible to set the volume of the plummet portion to be large. Therefore, even if the semiconductor acceleration sensor chip 10 is made thinner, sufficient moment of inertia will act. Accordingly, in addition to making the semiconductor acceleration sensor chip 10 thinner, it is even possible to make the overall structure of the semiconductor acceleration sensor 100 thinner. Furthermore, since sufficient moment of inertia should act, even if the beam portion 13 is formed with such thickness that can ensure predetermined mechanical intensity, it is possible to acquire sufficient sensitivity of the acceleration sensor.

Moreover, by ensuring the mechanical intensity of the beam portions 13, it is possible to improve the shock-resistance of the acceleration sensor, by which damage that may be caused in the manufacturing process and a possible reduction in the yield ratio can be prevented.

Furthermore, by disposing the beam portions 13 in the diagonal directions of the fixed portion 11 and the plummet portion 12, it is possible to set the length of the beam portions 13 to be long, and thereby it is possible to improve the sensitivity of the acceleration sensor even more.

Furthermore, by setting the spacing of the gap 14 wide, it is possible to prevent possible foreign substances that can be produced in the manufacturing process from entering into the gap 14 and inducing defects in the operation of the acceleration sensor.

Furthermore, by having the structure in which the projection portion 51a is formed on the bottom face portion 51 and the semiconductor acceleration sensor chip 10 is supported by and fixed to the upper surface of the projection portion 51a, it is possible to have the under surface of the fixed portion 11 and the under surface of the plummet portion 12 formed at approximately the same height. Therefore, the manufacturing process of the semiconductor acceleration sensor chip 10 can be simplified.

Second Embodiment

Figure 2A:
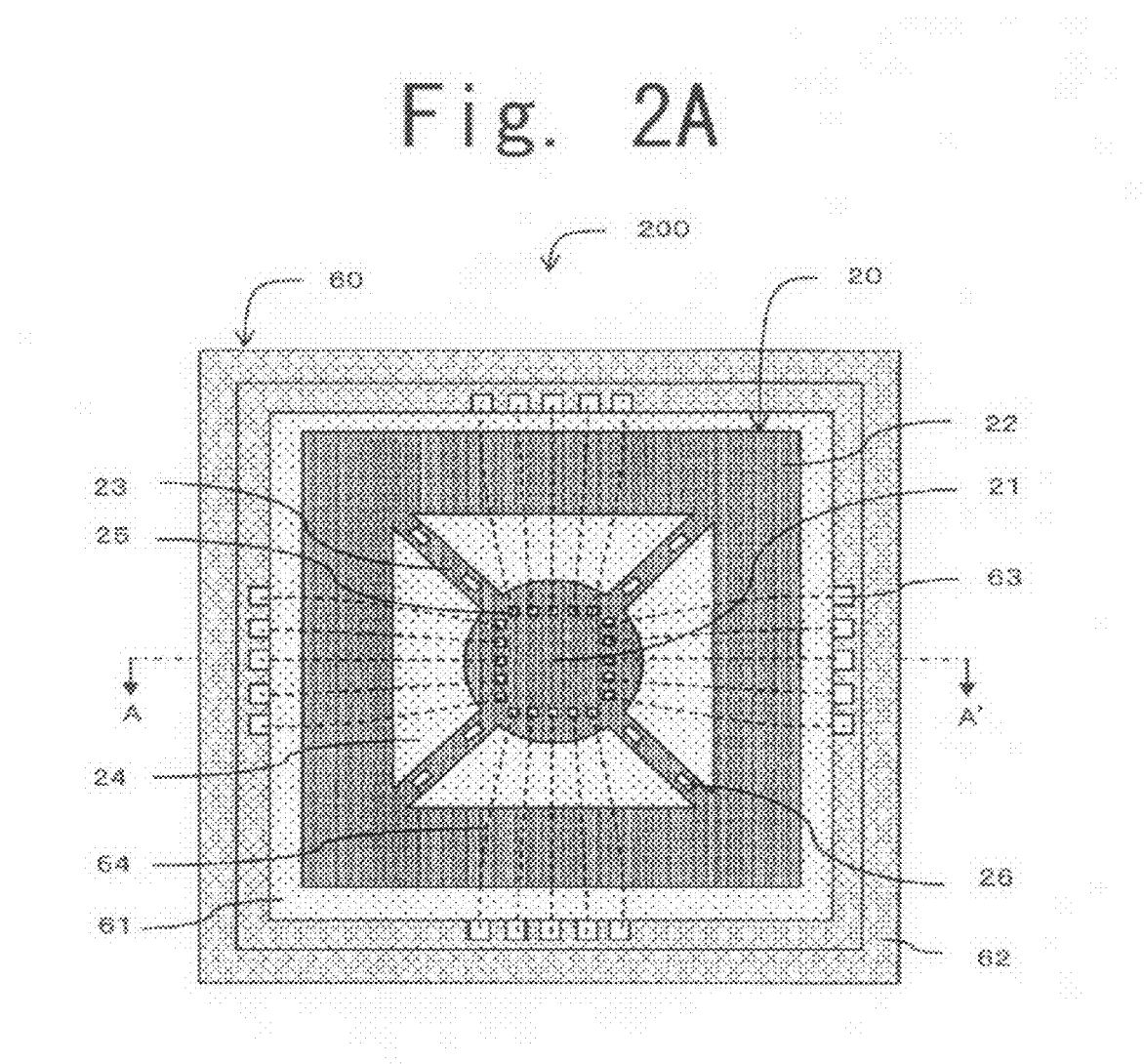
FIG. 2A and FIG. 2B are diagrams showing the structure of a semiconductor acceleration sensor according to a second embodiment of the present invention.
Figure 2B:
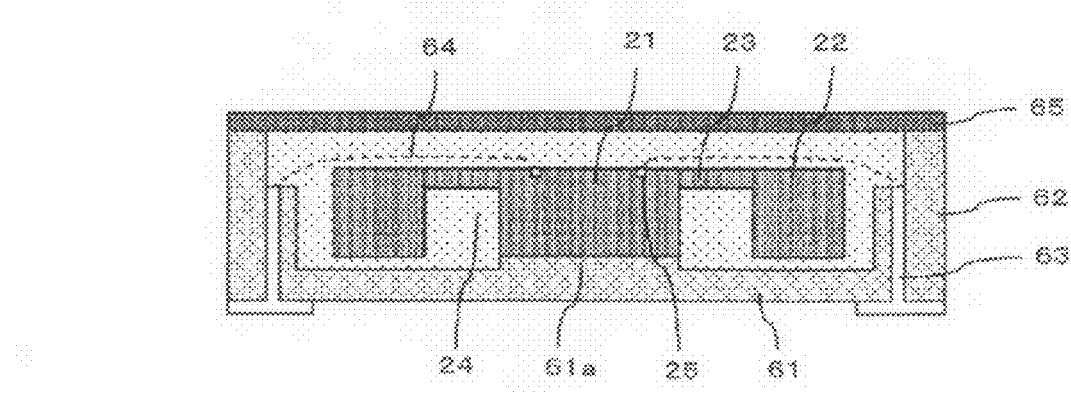

FIG. 2A and FIG. 2B are diagrams showing the structure of a semiconductor acceleration sensor 200 according to a second embodiment of the present invention. FIG. 2A is a plan view of the semiconductor acceleration sensor 200 when it is viewed from above, and FIG. 2B is a sectional view of the semiconductor acceleration sensor 200 taken along a line A-A' shown in FIG. 2A. Note that for convenience of explanation, FIG. 2A shows a state in which a cover 65, which is supposed to be placed on the upper surface of the semiconductor acceleration sensor 200, is removed.

The semiconductor acceleration sensor 200 has a semiconductor acceleration sensor chip 20 housed in a case 60 and it is hermetically sealed by the cover 65.

The semiconductor acceleration sensor chip 20 is formed using a silicon semiconductor substrate, for instance, and it has a fixed portion 21, a plummet portion 22 and beam portions 23.

The fixed portion 21 is placed at a central portion of the semiconductor acceleration sensor chip 20, and it has a circular cylinder structure in which the shape thereof when viewed from above is an approximate circle. A plurality of electrode pads 25 (which will be described later on) are disposed on the upper surface of the fixed portion 21 at predetermined intervals. The electrode pads 25 serve to take out signals from piezo elements 26 (which will be described later on) to the outside. The under surface of the fixed portion 21 is fixed on a projection portion 61a which is formed on a bottom face portion 61 of the case 60 (which will be described later on).

Figure 3:
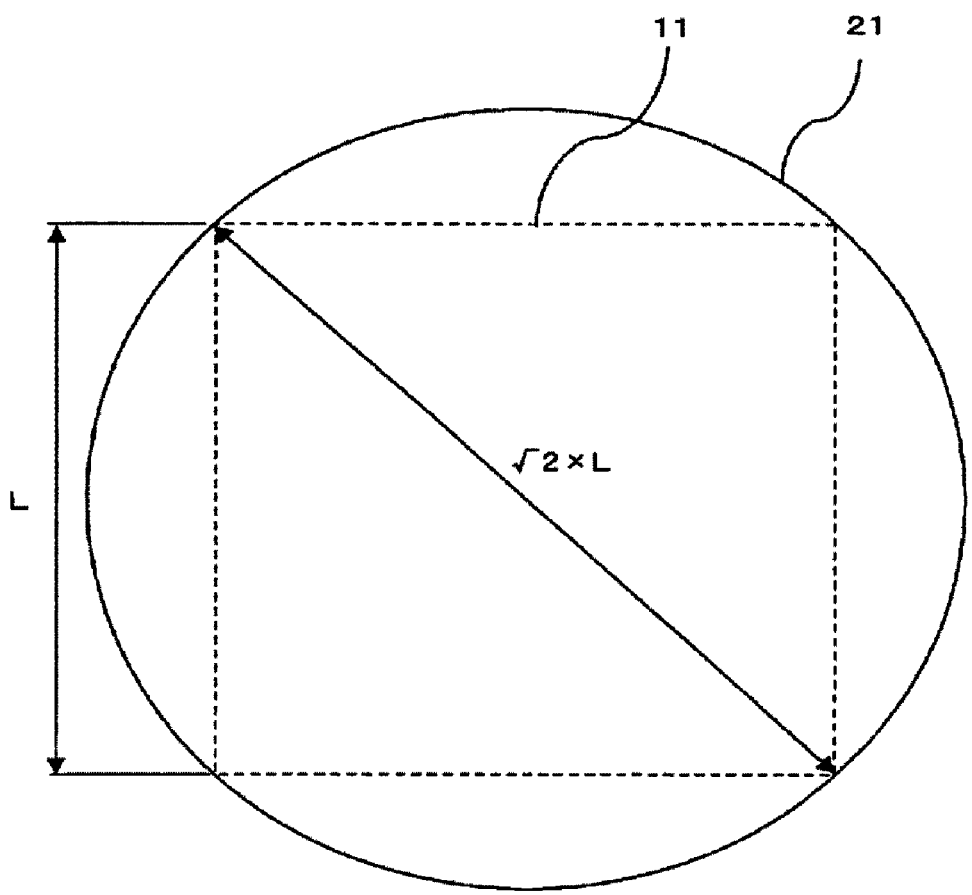
FIG. 3 is a comparative diagram showing the difference in the joint areas between a fixed portion in the first embodiment and a fixed portion in the second embodiment.

Although the shape of the fixed portion 11 viewed from above in the first embodiment is an approximate square, the shape of the fixed portion 21 viewed from an above in this embodiment is an approximate circle. The effect of this structure will be explained using a comparative diagram shown in FIG. 3. If a length of one side of the fixed portion 11 of which shape is an approximate square is set to L, the length of the diagonal line will be set to $\sqrt{2} \times L$. If the edge of the fixed portion 11 in which the shape thereof when viewed from above is an approximate square contacts with the edge of the fixed portion 21 in which the shape thereof when viewed from above is an approximate circle, the length of the diameter of the fixed portion 21 will be equal to the length of the diagonal line of the fixed portion 11, i.e. $\sqrt{2} \times L$. Therefore, the area of the upper face of the fixed portion 11 becomes $L \times L = L^2$, and the area of the upper face of the fixed portion 21 becomes $\pi \times (1/\sqrt{2})^2 \times L^2 = 1.57 \times L^2$. It means that the area of the upper face of the fixed portion 21 of which shape viewed from above is an approximate circle is about 1.57 times the area of the upper face of the fixed portion 11 in which the shape thereof when viewed from above is an approximate square. Accordingly, the bonded area between the semiconductor acceleration sensor chip 20 and the case 60 is larger than the first embodiment, and the conjugation strength is improved.

The plummet portion 22 is a frame like portion shaped in an approximate square, and it is located in a peripheral portion of the semiconductor acceleration sensor chip 20 and formed in a way which surrounds the fixed portion 21. By having the plummet portion 22 disposed in the peripheral portion of the semiconductor acceleration sensor chip 20, it is possible to set the volume of the plummet portion to be larger than the structure of the conventional semiconductor sensor chip, i.e. the structure in which the plummet portion is placed at a central portion of the semiconductor acceleration sensor chip. Thereby, even if the overall structure of the semiconductor acceleration sensor chip is made thinner, a predetermined moment of inertia will act, and it will be possible to prevent the sensitivity of the acceleration sensor from deteriorating. Moreover, the under surface of the fixed portion 21 and the under surface of the plummet portion 22 are formed at approximately the same height. This means that the manufacturing process of the semiconductor acceleration sensor chip 20 can be simplified. To be more precise, with respect to the structure of the conventional semiconductor acceleration sensor chip, a gap has to be formed between the under surface of the plummet portion and the under surface of the fixed portion in order to let the plummet portion displace more freely in response to the effects of acceleration, and an etching process is required in forming this gap. However, with respect to the semiconductor acceleration sensor chip 20 of this embodiment, since the under surface of the fixed portion 21 and the under surface of the plummet portion 22 are formed at approximately same height, there is no need for such etching process in order to form the gap.

The plummet portion 22 and the fixed portion 21 are separated by a gap 24. The gap 24 is set wider than the structure of the conventional semiconductor acceleration sensor chip. Thereby, it is possible to prevent possible foreign substance, such as chips that have fallen during the dicing process etc., from entering into the gap and disturbing the operation of the acceleration sensor.

The beam portions 23 are plate portions or thin portions of the semiconductor substrate, and they connect the fixed portion 21 and the plummet portion 22. The beam portions 23 are formed such that each beam portion 23 connects the fixed portion 21 and the plummet portion 22 in each line which connects the diagonal points of the plummet portion 22, and they are formed to have flexibility so that they will bend in response to the vertical and horizontal movements of the plummet portion 22. On the upper surface of each beam portion 23, a plurality of piezo elements 26 are formed at predetermined intervals. The piezo elements 26 will have their resistance values changed as the beam portions 23 bend in the vertical and horizontal directions by the act of acceleration. Signals based on the changes of resistance values of the piezo elements 26 are taken out to the outside by wirings (not shown) through the electrode pads 25. According to this embodiment, since the semiconductor acceleration sensor chip 20 has a structure in which the plummet portion 22 is located in the peripheral of the semiconductor acceleration sensor chip 20, it is possible to set the area of the plummet portion 22 to be large, as mentioned above. Accordingly, it is possible to acquire a desirable level of sensitivity in the acceleration sensor without having to reduce the thickness of the beam portions 23. Furthermore, by disposing the beam portions 23 in the diagonal directions of the plummet portion 22, it is possible to set the length of the beam portions 23 to be long, and thereby it is possible to improve the sensitivity of the acceleration sensor even more.

The case 60 is formed using a ceramic, for instance, and it has a bottom face portion 61 and a side portion 62.

The bottom face portion 61 has a projection portion 61a at its central portion, and the outer shape of the projection portion 61a when viewed from above is an approximate circle. The semiconductor acceleration sensor chip 20 is supported by and fixed to the bottom face portion 61 via the upper surface of the projection portion 61a. The fixation of the semiconductor acceleration sensor chip 20 to the upper surface of the projection portion 61a is done, for example, by hardening a thermosetting resin such as epoxy resin, silicon resin etc., by a heat treatment at 150° C. for 1 hour. The height of the projection portion 61a is 30 μm, for instance, and the height of the fixed portion 21 of the semiconductor acceleration sensor chip 20 can be made effectively higher than the plummet portion 22 by as much as the height of the projection portion 61a. Due to such arrangement, without touching the bottom face portion 61, the plummet portion 22 is able to move freely in response to the act of acceleration. For instance, the projection portion 61a can be formed when manufacturing the case 60 made of ceramic, by attaching an approximately circle green sheet, which is supposed to become the projection portion 61a, to the surface of a portion of ceramic material, i.e. the surface of a green sheet, which is supposed to become the bottom face portion 61, and then sinter the circle green sheet. As to a manufactured case which does not have the projection portion 61a, it is possible to form the projection portion 61a by attaching an approximately circle resin film (e.g. epoxy film) during the mounting process of the semiconductor acceleration sensor chip 20.

The side portion 62 is a sidewall of the case 60 which is formed as being integrated with the bottom face portion 61. In the central portion of each of the four sides of the side portion 62, a plurality of wiring holes are formed, and external wiring electrodes 63 leading to the exterior of the case 60 are disposed at predetermined intervals so as to pass through these wiring holes. The electrode pads 25 of the semiconductor acceleration sensor chip 20 and the external wiring electrodes 63 are electrically connected by bonding wires 64. In this case, for instance, wire bonding is done by using gold wires as materials, and by an ultrasonic concomitant thermocompression bonding method at a temperature of 230° C. In the semiconductor acceleration sensor chip 20 of this embodiment, since the electrode pads 25 are disposed on the surface of the fixed portion 21 which is supported and fixed by the projection portion 61a, the semiconductor acceleration sensor chip 20, especially the beam portions 23 will not be damaged in the wire bonding process for connecting the electrode pads 25 and the external wiring electrodes 63.

On the upper portion of the case 60, a metal cover 65 is attached. The cover 65 is made using 42 alloy, SUS (stainless steel) etc. as a material, and it is attached on the side portion 62 of the case 60 using a thermosetting resin so that the case 60 is sealed. The interior of the case 60 is purged by an $N_2$ gas or a dry air.

According to the semiconductor acceleration sensor 200 of the second embodiment of the present invention, the same effects as the semiconductor acceleration sensor 100 according to the first embodiment of the present invention can be obtained. That is, the plummet portion 22 of the semiconductor acceleration sensor chip 20 is disposed in the peripheral portion, and thereby it is possible to set the volume of the plummet portion to be large. Therefore, even if the semiconductor acceleration sensor chip 20 is made thinner, sufficient moment of inertia will act. Accordingly, in addition to making the semiconductor acceleration sensor chip 20 thinner, it is even possible to make the overall structure of the semiconductor acceleration sensor 200 thinner. Furthermore, since sufficient moment of inertia should act, even if the beam portion 23 is formed with such thickness that can ensure predetermined mechanical intensity, it is possible to acquire sufficient sensitivity of the acceleration sensor. Moreover, by ensuring the mechanical intensity of the beam portions 23, it is possible to improve the shock-resistance of the acceleration sensor, by which damage that may be caused in the manufacturing process and a possible reduction in the yield ratio can be prevented.

Furthermore, by disposing the beam portions 23 in the diagonal directions of the plummet portion 22, it is possible to set the length of the beam portions 23 to be long, and thereby it is possible to improve the sensitivity of the acceleration sensor even more.

Furthermore, by setting the spacing of the gap 24 wide, it is possible to prevent possible foreign substances that can be produced in the manufacturing process from entering into the gap 24 and inducing defects in the operation of the acceleration sensor.

Furthermore, by having the structure in which the projection portion 61a is formed on the bottom face portion 61 and the semiconductor acceleration sensor chip 20 is supported by and fixed to the upper surface of the projection portion 61a, it is possible to have the under surface of the fixed portion 21 and the under surface of the plummet portion 22 formed at approximately the same height. Therefore, the manufacturing process of the semiconductor acceleration sensor chip 20 can be simplified.

Moreover, according to the second embodiment of the present invention, the fixed portion 21 of the semiconductor acceleration sensor chip 20 has a circular cylinder structure in which the shape thereof when viewed from above is an approximate circle. In this structure, the bonded area between the semiconductor acceleration sensor chip 20 and the case 60 is larger, and thereby the conjugation strength is improved. Therefore, in this embodiment, in addition to the above-mentioned effects, it is possible to further improve the shock-resistance of the acceleration sensor.

Third Embodiment

Figure 4A:
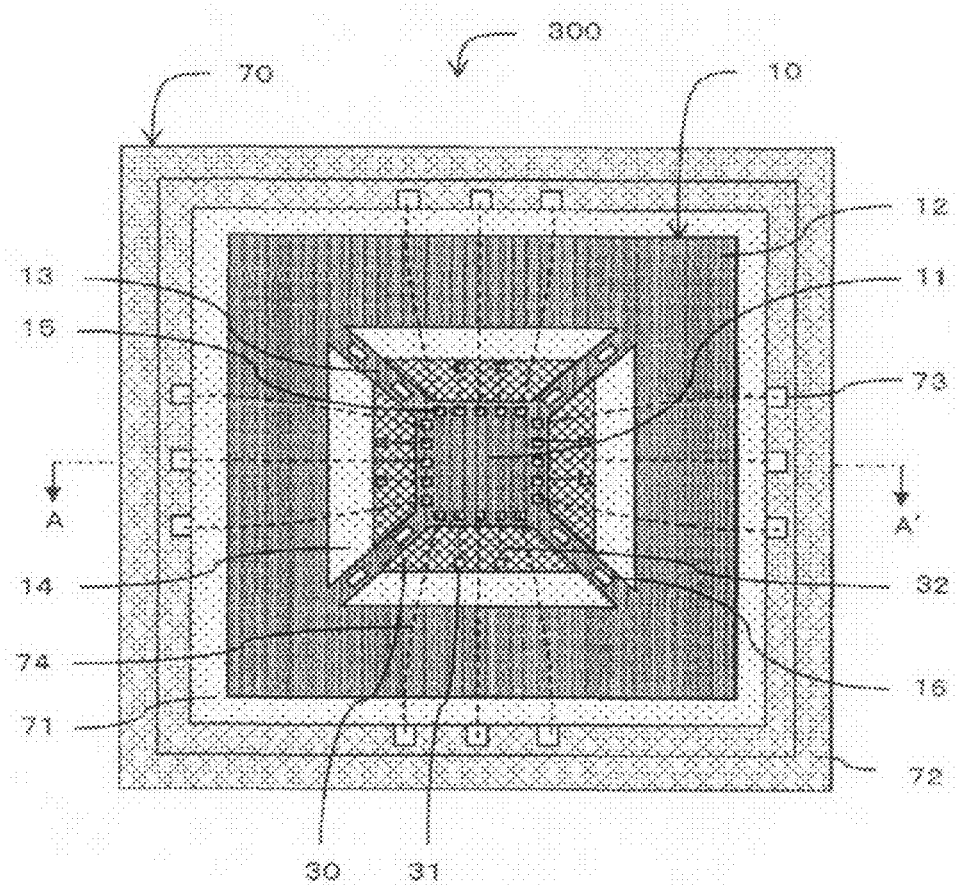
FIG. 4A and FIG. 4B are diagrams showing the structure of a semiconductor acceleration sensor according to a third embodiment of the present invention.
Figure 4B:
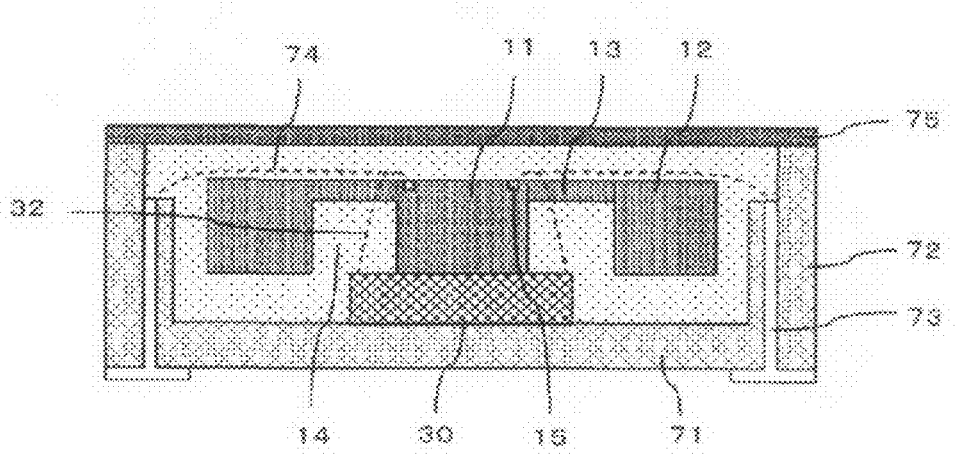

FIG. 4A and FIG. 4B are diagrams showing the structure of a semiconductor acceleration sensor 300 according to a third embodiment of the present invention. FIG. 4A is a plan view of the semiconductor acceleration sensor 300 when it is viewed from above, and FIG. 4B is a sectional view of the semiconductor acceleration sensor 300 taken along a line A-A' shown in FIG. 4A. Note that for convenience of explanation, FIG. 4A shows a state in which a cover 75, which is supposed to be placed on the upper surface of the semiconductor acceleration sensor 300, is removed.

The semiconductor acceleration sensor 300 has a structure in which a semiconductor acceleration sensor chip 10 or 20 is mounted on an integrated circuit 30 which controls the semiconductor acceleration sensor chip 10 or 20, and is housed in a case 70 together with the integrated circuit 30 which is hermetically sealed by the cover 75.

In this embodiment, both the semiconductor acceleration sensor chip 10 according to the first embodiment and the semiconductor acceleration sensor chip 20 according to the second embodiment are applicable. In the following, a case where the semiconductor acceleration sensor chip 10 is applied will be described in order to make the following explanation simple. In addition, in the following, the same reference numbers will be used for the structural elements that are the same as the semiconductor acceleration sensor chip 10 in the first embodiment, and redundant explanations of those structure elements will be omitted.

The integrated circuit 30 is an IC for correcting sensitivity and misalignment in the X, Y and Z axes. The under surface of the integrated circuit 30 is fixed on a bottom face portion 71 of the case 70 (which will be described later on). The semiconductor acceleration sensor chip 10 is mounted on the upper surface of the integrated circuit 30. The fixation of the semiconductor acceleration sensor chip 10 to the upper surface of the integrated circuit 30 is done, for instance, by hardening a thermosetting resin such as epoxy resin, silicon resin etc., by a heat treatment at 150° C. for 1 hour. A plurality of electrode pads 31 for transmitting signals between the integrated circuit 30 and the semiconductor acceleration sensor chip 10 are disposed on the upper surface of the integrated circuit 30 at predetermined intervals. The electrode pads 31 are electrically connected to several electrode pads 15 of the semiconductor acceleration sensor chip 10 via bonding wires 32 which pass through the gap 14. In this case, for instance, wire bonding is done by using gold wires as materials, and by an ultrasonic concomitant thermocompression bonding method at a temperature of 230° C. The integrated circuit 30 in this embodiment achieves structurally the same function as the projection portion 51a of the case 50 in the first embodiment. In other words, in this embodiment, the height of the fixed portion 11 of the semiconductor acceleration sensor chip 10 can be made effectively higher than the plummet portion 12 by as much as the height of the integrated circuit 30. Due to such arrangement, without touching the bottom face portion 71, the plummet portion 12 is able to move freely in response to the act of acceleration.

The case 70 is formed using a ceramic, for instance, and it has the bottom face portion 71 and a side portion 72.

The semiconductor acceleration sensor chip 10 is supported by and fixed to the upper surface of the bottom face portion 71. The fixation of the semiconductor acceleration sensor chip 10 to the upper surface of the bottom face portion 71 is done, for example, by hardening a thermosetting resin such as epoxy resin, silicon resin etc., by a heat treatment at 150° C. for 1 hour.

The side portion 72 is a sidewall of the case 70 which is formed as being integrated with the bottom face portion 71. In the central portion of each of the four sides of the side portion 72, a plurality of wiring holes are formed, and external wiring electrodes 73 leading to the exterior of the case 70 are disposed at predetermined intervals so as to pass through these wiring holes. The electrode pads 15 of the semiconductor acceleration sensor chip 10 and the external wiring electrodes 73 are electrically connected by bonding wires 74. In this case, for instance, wire bonding is done by using gold wires as materials, and by an ultrasonic concomitant thermocompression bonding method at a temperature of 230° C. In the semiconductor acceleration sensor chip 10 of this embodiment, since the electrode pads 15 are disposed on the surface of the fixed portion 11 which is supported and fixed by the integrated circuit 30, the semiconductor acceleration sensor chip 10, especially the beam portions 13, will not be damaged in the wire bonding process for connecting the electrode pads 15 and the external wiring electrodes 73.

On the upper portion of the case 70, a metal cover 75 is attached. The cover 75 is made using 42 alloy, SUS (stainless steel), etc. as a material, and it is attached on the side portion 72 of the case 70 using a thermosetting resin so that the case 70 is sealed. The interior of the case 70 is purged by an $N_2$ gas or a dry air.

According to the semiconductor acceleration sensor 300 of the third embodiment of the present invention, the plummet portion 12 (22) of the semiconductor acceleration sensor chip 10 (20) is disposed in the peripheral portion, and thereby it is possible to set the volume of the plummet portion to be large. Therefore, even if the semiconductor acceleration sensor chip 10 (20) is made thinner, sufficient moment of inertia will act. Accordingly, it is possible to make the semiconductor acceleration sensor chip 10 (20) thinner. Furthermore, since sufficient moment of inertia should act, even if the beam portion 13 (23) is formed with such thickness that can ensure predetermined mechanical intensity, it is possible to acquire sufficient sensitivity of the acceleration sensor. Moreover, by ensuring the mechanical intensity of the beam portions 13 (23), it is possible to improve the shock-resistance of the acceleration sensor, by which damage that may be caused in the manufacturing process and a possible reduction in the yield ratio can be prevented.

Furthermore, by disposing the beam portions 13 (23) in the diagonal directions of the plummet portion 12 (22), it is possible to set the length of the beam portions 13 (23) to be long, and thereby it is possible to improve the sensitivity of the acceleration sensor even more.

Furthermore, by setting the spacing of the gap 14 (24) wide, it is possible to prevent possible foreign substances that can be produced in the manufacturing process from entering into the gap 14 (24) and inducing defects in the operation of the acceleration sensor.

Furthermore, by having the structure in which the integrated circuit 30 is disposed between the bottom face portion 71 and the semiconductor acceleration sensor chip 10 (20) and the semiconductor acceleration sensor chip 10 (20) is supported by and fixed to the upper surface of the integrated circuit 30, it is possible to have the under surface of the fixed portion 11 (21) and the under surface of the plummet portion 12 (22) formed at approximately the same height. Therefore, the manufacturing process of the semiconductor acceleration sensor chip 10 (20) can be simplified.

Moreover, by having a structure in which the semiconductor acceleration sensor chip 10 (20) is mounted on the integrated circuit 30, it is possible to downsize the semiconductor acceleration sensor 300 housing the integrated circuit 30 and the semiconductor acceleration sensor chip 10 (20).

Moreover, by passing the bonding wires 32 which connect the electrode pads 15 (25) of the semiconductor acceleration sensor chip 10 (20) and the electrode pads 31 of the integrated circuit 30 with the bonding wires 32 through the gap 14, it is possible to shorten the length of the bonding wires 32, and thus noise resistance can be improved.

Fourth Embodiment

FIG. 5A and FIG. 5B are diagrams showing the structure of a semiconductor acceleration sensor 400 according to a fourth embodiment of the present invention. FIG. 5A is a plan view of the semiconductor acceleration sensor 400 when it is viewed from above, and FIG. 5B is a sectional view of the semiconductor acceleration sensor 400 taken along a line A-A' shown in FIG. 5A. Note that for convenience of explanation, FIG. 5A shows a state in which a cover 85, which is supposed to be placed on the upper surface of the semiconductor acceleration sensor 400, is removed.

The semiconductor acceleration sensor 400 has a structure in which the semiconductor acceleration sensor chip 10 or 20 and an integrated circuit 40 which are arranged side-by-side are housed in a case 80, which is hermetically sealed by the cover 85.

In this embodiment, both of the semiconductor acceleration sensor chip 10 according to the first embodiment and the semiconductor acceleration sensor chip 20 according to the second embodiment are applicable. In the following, a case where the semiconductor acceleration sensor chip 10 is applied will be described in order to make the following explanation simple. In addition, in the following, the same reference numbers will be used for the structural elements that are the same as the semiconductor acceleration sensor chip 10 in the first embodiment, and redundant explanations of those structure elements will be omitted.

The integrated circuit 40 is an IC for correcting sensitivity and misalignment in the X, Y and Z axes. The integrated circuit 40 is arranged side-by-side with the semiconductor acceleration sensor chip 10. The under surface of the integrated circuit 40 is fixed on a bottom face portion 81 of the case 80 (which will be described later on). A plurality of electrode pads 41 for transmitting signals between the integrated circuit 40 and the semiconductor acceleration sensor chip 10 and between the integrated circuit 40 and external circuits are disposed on the upper surface of the integrated circuit 40 at predetermined intervals. The electrode pads 41 are electrically connected to several electrode pads 15 of the semiconductor acceleration sensor chip 10 and external wiring electrodes 83 via bonding wires 42. In this case, for instance, wire bonding is done by using gold wires as materials, and by an ultrasonic concomitant thermocompression bonding method at a temperature of 230° C.

The case 80 is formed using a ceramic, for instance, and it has the bottom face portion 81 and a side portion 82.

The bottom face portion 81 has a projection portion 81a at its central portion, and the outer shape of the projection portion 81a when viewed from above is an approximate square. The semiconductor acceleration sensor chip 10 is supported by and fixed to the bottom face portion 81 via the upper surface of the projection portion 81a. The fixation of the semiconductor acceleration sensor chip 10 to the upper surface of the projection portion 81a is done, for example, by hardening a thermosetting resin such as epoxy resin, silicon resin etc., by a heat treatment at 150° C. for 1 hour. The height of the projection portion 81a is 30 μm, for instance, and the height of the fixed portion 11 of the semiconductor acceleration sensor chip 10 can be made effectively higher than the plummet portion 12 by as much as the height of the projection portion 81a. Due to such arrangement, without touching the bottom face portion 81, the plummet portion 12 is able to move freely in response to the act of acceleration. For instance, the projection portion 81a can be formed when manufacturing the case 80 made of ceramic, by attaching an approximately square green sheet, which is supposed to become the projection portion 81a, to the surface of a portion of ceramic material, i.e. the surface of a green sheet, which is supposed to become the bottom face portion 81, and then sinter the square green sheet. As to a manufactured case which does not have the projection portion 81a, it is possible to form the projection portion 81a by attaching an approximately square resin film (e.g. epoxy film) at the mounting process of the semiconductor acceleration sensor chip 10.

The side portion 82 is a sidewall of the case 80 which is formed as being integrated with the bottom face portion 81. In the central portion of each of the four sides of the side portion 82, a plurality of wiring holes are formed, and external wiring electrodes 83 leading to the exterior of the case 80 are disposed at predetermined intervals so as to pass through these wiring holes. The electrode pads 15 of the semiconductor acceleration sensor chip 10 and the external wiring electrodes 83 are electrically connected by bonding wires 84. The electrode pads 41 of the integrated circuit 40 and the external wiring electrodes 83 are electrically connected by bonding wires 42. In this case, for instance, wire bonding is done by using gold wires as materials, and by an ultrasonic concomitant thermocompression bonding method at a temperature of 230° C. In the semiconductor acceleration sensor chip 10 of this embodiment, since the electrode pads 15 are disposed on the surface of the fixed portion 11 which is supported and fixed by the projection portion 81a, the semiconductor acceleration sensor chip 10, especially the beam portions 13 will not be damaged in the wire bonding process for connecting the electrode pads 15 and the external wiring electrodes 83.

On the upper portion of the case 80, a metal cover 85 is attached. The cover 85 is made using 42 alloy, SUS (stainless steel) etc. as a material, and it is attached on the side portion 82 of the case 80 using a thermosetting resin so that the case 80 is sealed. The interior of the case 80 is purged by an $N_2$ gas or a dry air.

According to the semiconductor acceleration sensor 400 of the fourth embodiment of the present invention, the plummet portion 12 (22) of the semiconductor acceleration sensor chip 10 (20) is disposed in the peripheral portion, and thereby it is possible to set the volume of the plummet portion to be large. Therefore, even if the semiconductor acceleration sensor chip 10 (20) is made thinner, sufficient moment of inertia will act. Accordingly, it is possible to make the semiconductor acceleration sensor chip 10 (20) thinner. Furthermore, since sufficient moment of inertia should act, even if the beam portion 13 (23) is formed with such thickness that can ensure predetermined mechanical intensity, it is possible to acquire sufficient sensitivity of the acceleration sensor. Moreover, by ensuring the mechanical intensity of the beam portions 13 (23), it is possible to improve the shock-resistance of the acceleration sensor, by which damage that may be caused in the manufacturing process and a possible reduction in the yield ratio can be prevented.

Furthermore, by disposing the beam portions 13 (23) in the diagonal directions of the plummet portion 12 (22), it is possible to set the length of the beam portions 13 (23) to be long, and thereby it is possible to improve the sensitivity of the acceleration sensor even more.

Furthermore, by setting the spacing of the gap 14 (24) wide, it is possible to prevent possible foreign substances that can be produced in the manufacturing process from entering into the gap 14 (24) and inducing defects in the operation of the acceleration sensor.

Furthermore, by having the structure in which the projection portion 81a is formed on the bottom face portion 81 and the semiconductor acceleration sensor chip 10 (20) is supported by and fixed to the upper surface of the projection portion 81a, it is possible to have the under surface of the fixed portion 11 (21) and the under surface of the plummet portion 12 (22) formed at approximately same height. Therefore, the manufacturing process of the semiconductor acceleration sensor chip 10 (20) can be simplified.

Moreover, by having a structure in which the semiconductor acceleration sensor chip 10 (20) and the integrated circuit 40 are arranged side-by-side, it is possible to make the overall structure of the semiconductor acceleration sensor 400 thinner.

This application claims priority to Japanese Patent Application No. 2004-367933. The entire disclosures of Japanese Patent Application No. 2004-367933 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

In the present application, some aspects of the present invention as described above are not stated in the claims, but they are obvious aspects of the present invention and may be claimed in another application. These aspects include the following.

In accordance with a first aspect of the present invention, an acceleration sensor comprises a semiconductor acceleration sensor chip, an integrated circuit and a case. The semiconductor acceleration sensor chip has a fixed portion, a plummet portion surrounding the fixed portion without contacting the fixed portion, and a beam portion connecting the fixed portion and the plummet portion. The thickness of the beam portion is thinner than the thickness of the fixed portion. The integrated circuit is fixed to the bottom face of the semiconductor acceleration sensor chip. The case has a cavity housing the semiconductor acceleration sensor chip and the integrated circuit. The bottom face of the integrated circuit is fixed to the bottom face of the cavity of the case.

In accordance with a second aspect of the present invention, in the acceleration sensor according to the first aspect of the present invention, the shape of the plummet portion is an approximately square column which has a cavity for housing the fixed portion in the center thereof, and the beam portion connects the plummet portion and the fixed portion on the diagonal line of the cavity of the plummet portion.

In accordance with a third aspect of the present invention, the acceleration sensor according to the second aspect of the present invention further comprises first electrodes formed on the surface of the fixed portion at predetermined intervals.

In accordance with a fourth aspect of the present invention, the acceleration sensor according to the third aspect of the present invention further comprises second electrodes formed on the surface of the integrated circuit at predetermined intervals.

In accordance with a fifth aspect of the present invention, the acceleration sensor according to the fourth aspect of the present invention further comprises bonding wires electrically connecting the first electrodes and the second electrodes through a space between the fixed portion and the plummet portion.

In accordance with a sixth aspect of the present invention, in the acceleration sensor according to the fifth aspect of the present invention, the bonding wire is a gold wire and bonded to the first electrode and the second electrode by means of an ultrasonic concomitant thermocompression bonding method.

In accordance with a seventh aspect of the present invention, the acceleration sensor according to the fifth aspect of the present invention further comprises external wiring electrodes formed at one or more side faces of the case, the external wiring electrodes being electrically led to the exterior of the case; and bonding wires electrically connecting the first electrodes and the external wiring electrodes.

In accordance with an eighth aspect of the present invention, in the acceleration sensor according to the seventh aspect of the present invention, the bonding wire is a gold wire and bonded to the first electrode and the external wiring electrode by means of an ultrasonic concomitant thermocompression bonding method.

In accordance with a ninth aspect of the present invention, in the acceleration sensor according to the seventh aspect of the present invention, the shape of the fixed portion is an approximately square column.

In accordance with a tenth aspect of the present invention, in the acceleration sensor according to the seventh aspect of the present invention, the shape of the fixed portion is an approximately circular cylinder.

What is claimed is:
1. An acceleration sensor comprising:
a case that includes:
 a bottom wall having a top side and a bottom side, the top side of the bottom wall having a central region and a peripheral region that surrounds the central region; and
 a side wall attached to the bottom wall and extending upward from the bottom wall in a height direction;
an integrated circuit attached to the central region of the top side of the bottom wall, the integrated circuit having a top side with a predetermined width;
a semiconductor acceleration sensor chip supported on the integrated circuit, the sensor chip including:
 a fixed portion having a bottom side that is mounted on the top side of the integrated circuit, the bottom side of the fixed portion having a predetermined width;
 a plummet portion surrounding the integrated circuit without contacting the integrated circuit, the plummet portion being disposed outward of the integrated circuit, above the peripheral region of the top side of the bottom wall, the plummet portion having a bottom side with a predetermined width; and
 a beam portion connecting the fixed portion and the plummet portion, the beam portion having a thickness that is thinner than the thickness of the fixed portion;
a terminal outside the case;
first wiring that electrically connects the terminal to the sensor chip; and
second wiring that electrically connects the integrated circuit to the sensor chip, wherein the width of the top side of the integrated circuit is greater than the width of the bottom side of the fixed portion and smaller than the width of the bottom side of the plummet portion.

2. The acceleration sensor according to claim 1, further comprising:

a plurality of first electrodes on a surface of the fixed portion; and a plurality of second electrodes on a surface of the integrated circuit, wherein the second wiring includes a bonding wire that electrically connects one of the first electrodes and one of the second electrodes.

3. The acceleration sensor according to claim 1, wherein the wiring has a portion that is embedded in the side wall and extends in the height direction of the side wall.

4. The acceleration sensor according to claim 1, wherein the terminal is disposed on the bottom side of the bottom wall at a position aligned with the portion of the wiring that is embedded in the side wall and that extends in the height direction of the side wall.

5. The acceleration sensor according to claim 1, wherein the bottom side of the plummet portion and the bottom side of the fixed portion lie substantially in a common plane, and wherein the plummet portion and the fixed portion have substantially the same thickness.

* * * * *